United States Patent [19]

White et al.

[11] Patent Number: 5,732,003
[45] Date of Patent: Mar. 24, 1998

[54] SAWTOOTH PHASE FILTER

[75] Inventors: Stanley A. White, San Clemente; Jeffrey P. Woodard, Irvine, both of Calif.

[73] Assignee: Boeing North American, Inc., Seal Beach, Calif.

[21] Appl. No.: 634,003

[22] Filed: Apr. 15, 1996

[51] Int. Cl.⁶ ............................................. G06F 17/10
[52] U.S. Cl. .............................. 364/724.011; 364/724.17
[58] Field of Search .......................... 364/724.011, 724.17

[56] References Cited

U.S. PATENT DOCUMENTS

| | | | |
|---|---|---|---|
| 4,751,663 | 6/1988 | Yamazaki | 364/724.011 |
| 5,337,264 | 8/1994 | Levien | 364/724.17 |
| 5,440,503 | 8/1995 | Maruyama | 364/724.011 |

*Primary Examiner*—David H. Malzahn
*Attorney, Agent, or Firm*—Charles T. Silberberg; Tom Streeter

[57] ABSTRACT

Noise may be reduced or eliminated from a digital sawtooth signal representing the phase of a periodic signal. This may be done precisely, even when inexpensive fixed-point arithmetic is used. In one aspect of the invention, the input signal (noise plus true signal) 12 is filtered to produce, in succession: (a) mod one differentiated noise plus slope of true phase signal 28; (b) mod one differentiated noise plus slope of residual phase signal (true phase signal minus estimated slope of true phase signal) 36; (c) mod one differentiated noise 46; (d) estimated noise 62; and (e) smoothed phase signal 72. In a second aspect, a noisy phase signal 12 is extracted from a first arbitrary periodic signal and the above steps are used to generate a noise-reduced phase signal 72. The noise-reduced phase signal 72 is then used to generate a second arbitrary periodic signal of the same frequency.

16 Claims, 4 Drawing Sheets

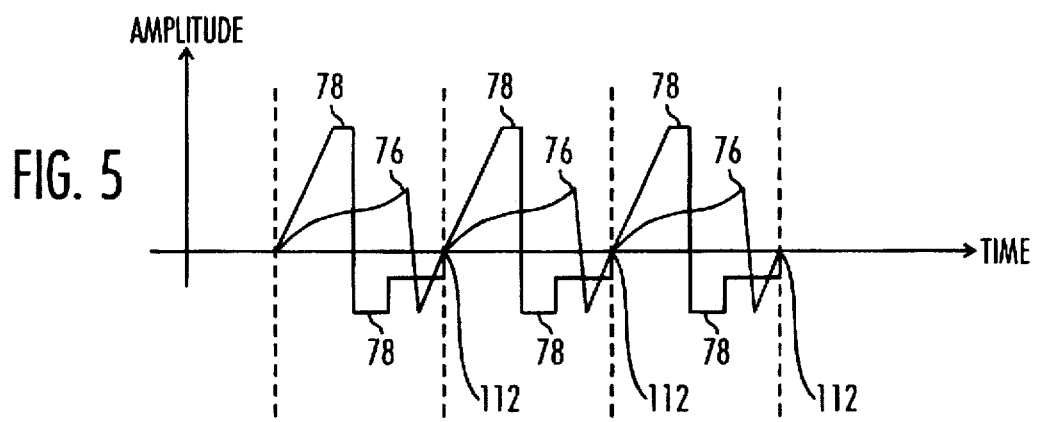
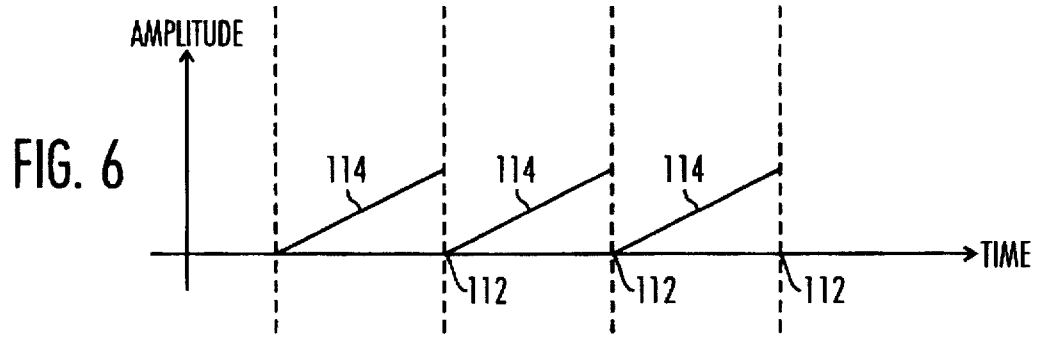
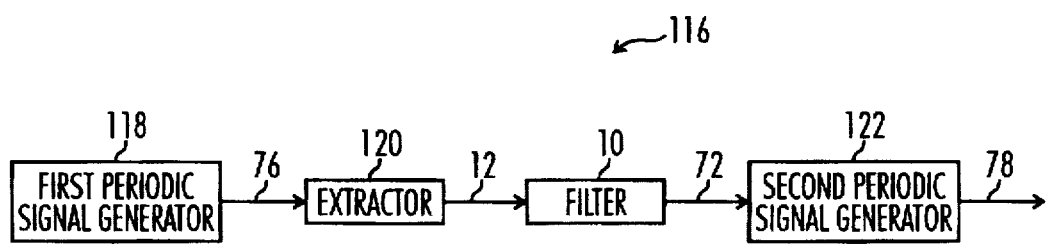
FIG. 7

1

SAWTOOTH PHASE FILTER

BACKGROUND OF THE INVENTION

The present invention relates to digital signal processing. In one aspect, it has particular relation to removing noise from a digital sawtooth signal representing the phase of a sinusoidal (or other periodic) analog signal produced by a periodic signal generator. In another aspect, it has particular relation to converting any arbitrary periodic signal to any another arbitrary periodic signal of the same frequency.

Electronically driven tuning forks are becoming important in inertial navigation. Applicant White has disclosed a variety of inventions related to a digital quartz inertial measurement unit in the following U.S. Pat. Nos.:

| Patent Number | Title | Issue Date |
| --- | --- | --- |
| 5,179,380 | One-Bit Sigma-Delta Modulator with Improved Signal Stability | 01/12/93 |
| 5,339,263 | Decimator/Interpolator Filter for ADC and DAC | 08/16/94 |
| 5,361,036 | Complex Digital Demodulator Employing Chebychev-Approximation Derived Synthetic-Sinusoid Generator | 11/01/94 |
| 5,400,269 | Closed-Loop Baseband Controller for a Rebalance Loop of a Quartz Angular-Rate Sensor | 03/21/95 |
| 5,444,639 | Angular-Rate-Sensing System and Method with Digital Synthesizer and Variable-Frequency Oscillator | 08/22/95 |
| 5,444,641 | Admittance-Parameter Estimator for a Piezoelectric Resonator in an Oscillator Circuit | 08/22/95 |
| 5,459,432 | Use of a Chopper and a Sigma-Delta Modulator for Downconverting and Digitizing an Analog Signal Including Information Modulated by a Carrier | 10/17/95 |
| 5,463,575 | Reduced Quantization Noise from a Single-Precision Multiplier | 10/31/95 |
| 5,471,396 | Estimator of Amplitude and Frequency of a Noisy Biased Sinusoid from a Short Burst of Samples | 11/28/95 |
| 5,487,015 | Self-Oscillating Driver circuit for a Quartz Resonator of an Angular-Rate Sensor | 01/23/96 |
| 5,491,725 | A Tracking Filter and Quadrature Phase-Reference Generator | 02/13/96 | and in the following U.S. patent applications:

| Serial Number | Title | File Date |
| --- | --- | --- |
| 08/356,934 | A Frequency and Phase-Locked Two-Phase Digital Synthesizer | 12/15/94 |
| 08/116,860 | Amplitude Detection and Automatic Gain Control of a Sparsely Sampled Sinusoid by Adjustment of a Notch Filter | 09/07/93 |
| 08/120,871 | Amplitude Detection and Automatic Gain Control of a Sparsely Sampled Sinusoid by Computation Including a Hilbert Transform | 09/07/93 |
| 08/316,143 | A Demodulator/Reference Generator Based on Two Cascaded Hilbert Transformers | 09/30/94 |
| 08/383,142 | Sensor with Resonator, Digital Filter, and Display | 02/03/95 |

The disclosures of these patents and applications are incorporated herein by reference.

The first aspect of the present invention notes that such turning forks, oscillators, and periodic signal generators in general, have a periodic signal. The periodic signal is generally, but not necessarily, sinusoidal. The phase of the periodic signal takes the form of a sawtooth signal, and this sawtooth signal is readily digitized.

However, digitization introduces noise. The underlying analog signal often includes noise as well. The first aspect of the present invention provides a digital filter for eliminating (or at least reducing) noise in a digital sawtooth signal.

2

In its second aspect, the present invention notes that two periodic signals, of arbitrary shape and amplitude, can have the same frequency. If the phase of the first periodic signal, from a first signal generator, can be accurately extracted and digitized, a second signal generator can use this information to construct the second periodic signal, using downstream apparatus. U.S. Pat. No. 5,361,036 discloses one example of such downstream apparatus.

As noted above, phase extraction and digitization is a noisy process, and the second periodic signal can be no better than the phase used to construct it. The filter according to the first aspect of the present invention is a good way of determining an accurate first-signal phase so that an accurate second signal can be constructed.

In both aspects, filtering the noise from such a sawtooth signal requires a trade off between cost and precision. Fixed-point arithmetic, for example, is inexpensive, but not overly precise.

SUMMARY OF THE INVENTION

The present invention in its first aspect greatly reduces the noise in digital sawtooth signals, and does so both cheaply and precisely. The input phase signal (noise plus true phase signal) is filtered to produce, in succession:

(a) modulo differentiated noise plus slope of true phase signal;

(b) modulo differentiated noise plus slope of residual phase signal slope (true phase signal minus estimated slope of the true phase signal);

(c) modulo differentiated noise;

(d) estimated noise; and (e) smoothed phase signal.

In its second aspect, the present invention extracts a noisy phase signal from a first arbitrary periodic signal and uses the above steps to generate a noise-reduced phase signal. The noise-reduced phase signal is then used to generate a second arbitrary periodic signal of the same frequency.

BRIEF DESCRIPTION OF THE DRAWINGS

FIG. 5 shows two arbitrary periodic signals of the same frequency.

FIG. 6 shows the phase of the signals of FIG. 5.

FIG. 7 is a schematic drawing of a hardware version of the second aspect of the present invention.

DETAILED DESCRIPTION OF THE DRAWINGS

First Aspect

Hardware Version

Figure 1:
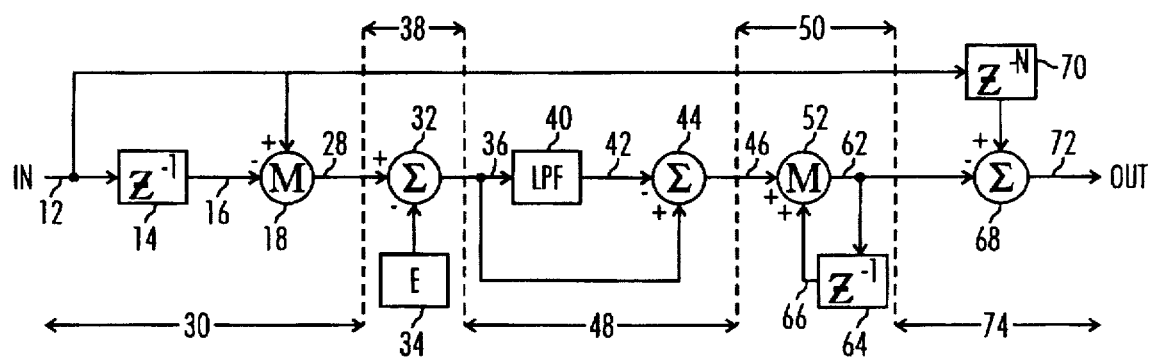
FIG. 1 is a schematic drawing of a hardware version of the first aspect of the present invention.

FIG. 1 shows an overall schematic view of a hardware version of the first aspect of present invention 10. A noisy input signal 12 is applied to a first delay element 14, which delays it for one sample period, and which produces a first delayed signal 16. A modulo subtracter 18 modulo subtracts the first delayed signal 16 from the input signal 12.

Figure 2:
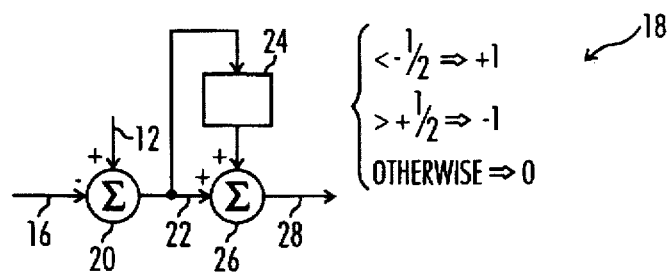
FIG. 2 is a schematic drawing of the mod one subtracter shown in FIG. 1.

FIG. 2 shows the details of the modulo subtracter 18. A first subtracter 20 subtracts the first delayed signal 16 from the noisy input signal 12 and produces a first difference 22. The first difference 22 is applied both to a first modulo filter 24 and to one input of a first adder 26. The first modulo filter 24 produces an output which is applied to a second input of the first adder 26. The output 28 of the first adder 26 is the output of the modulo subtracter 18.

The first modulo filter 24 is constructed to produce one of three outputs—a lower output, a middle output, or an upper output—depending of the input applied to the first modulo filter 24. It produces the lower output if the input is greater than an upper control limit. It produces the upper output if the input is less than a lower control limit. It produces the middle output if the input is between the lower control limit and the upper control limit.

The preferred first modulo filter 24 is a mod one filter. In such a filter, the lower control limit is minus one-half and the upper control limit is plus one-half. The lower output is minus one, the middle output is zero, and the upper output is plus one. Such a filter works well when, as is preferred, the noisy input signal 12 has been normalized to have a range between zero and one. These parameters are shown in FIG. 2.

If the noisy input signal 12 has been normalized to have a range between zero and two pi, then the lower control limit is minus pi and the upper control limit is plus pi. Likewise, the lower output is minus pi, the middle output is zero, and the upper output is plus pi. Other ranges for the noisy input signal 12 produce corresponding changes to the parameters of the first modulo filter. The first subtracter 20, first modulo filter 24, and first adder 26 together form the modulo subtracter 18, preferably a mod one subtracter 18. The preferred mod one subtracter 18 will be referred to throughout the remainder of the specification.

The output 28 of the mod one subtracter 18 is conventionally called mod one differentiated input 28, and the apparatus 30 described above is conventionally called a mod one differentiator 30. The mod one differentiated input 28 represents the mod one differentiated noise plus the slope of the true signal. The mod one differentiated input 28 is a useful sequence to know because it allows elimination of the distortion of the derivative of the noise which is created by the discontinuities in the sawtooth.

Note that the use of modulo arithmetic is directed to eliminating the distortion of the derivative of the noise. It is not directed to eliminating, or even reducing, the derivative of the noise, nor the noise itself. The whole purpose of the signal path from the input 12 to the negative input to subtractor 68 is to accurately, and without reduction or other distortion, estimate the noise. Once determined, the estimated noise can be subtracted from the noisy input signal 12, at the end of the present invention 10, to produce a smoothed signal 72. By using a mod one differentiator 30, followed by a mod one integrator 50, we exclude distortions in the noise estimate from the places where such distortions are most easily introduced: the discontinuities.

The output 28 of the mod one subtracter 18 is applied to a second subtracter 32, which subtracts from it an expected slope 34 of the sawtooth. It thereby produces a signal 36 representing the mod one differentiated noise plus residual slope (that is, the error in the slope produced by limited knowledge of what the expected slope really is). This stage 38 is conveniently called a residue forming stage 38.

The expected slope 34 can be computed with the knowledge that the slope of a sawtooth is proportional both to its range and to its frequency. The expected slope 34 of the sawtooth is therefore proportional to the product of its expected range and expected frequency. The expected range has preferably been normalized to lie between zero and one, but may be normalized to fall between any other pair of convenient limits. It is, in either case, a known quantity. This "expected frequency" is the expected frequency of the first periodic signal generator 86 (see FIG. 7). The expected frequency can be measured (or calculated) and locked in at the factory.

The actual frequency will deviate from the expected frequency in the field, but not very much, either with time or with temperature. A typical 10 KHz periodic signal generator (included in the noisy digital sawtooth signal generator 86) of the class considered will drift no more than 2 Hz (1/50 of 1%) over its service life. Applicants have performed experiments which show that the present invention 10 is functional over this narrow band. An excessively broad band causes the output 42 of the low pass filter 40 to become noisy.

The mod one differentiated noise plus slope of residual signal 36, produced from the second subtracter 32, is applied a low pass filter 40. The low pass filter 40 substantially eliminates the noise, and produces a good estimate of the slope of the residual signal 42. If the estimate of the expected frequency 34 is inaccurate, then the resulting slope of the residual signal 42 will be large and could cause distortion within the low pass filter 40.

The estimate of the slope of the residual signal 42 is applied to a third subtracter 44, which subtracts it from the mod one differentiated noise plus residual slope 36. Third subtracter 44 thereby produces mod one differentiated noise 46, substantially without distortion. This stage 48 may conveniently be called a high pass filter stage 48. It is important to mechanize it as the negative low pass filter 40 which is shown. More conventional high pass filters have produced unacceptable results because of the nonlinear round-off effects of finite word-length arithmetic. The most important region of operation is where the signal is below a least significant bit (LSB). The subtleties of the design lie in the long-term statistical behavior of sub-LSB signals.

The noise may be recovered from the mod one differentiated noise 46 by mod one integrating it in an integration stage 50. This stage is begun by applying the mod one differentiated noise 46 to a modulo adder 52, preferably (to conform to the mod one subtracter 18) a mod one adder 52.

Figure 3:
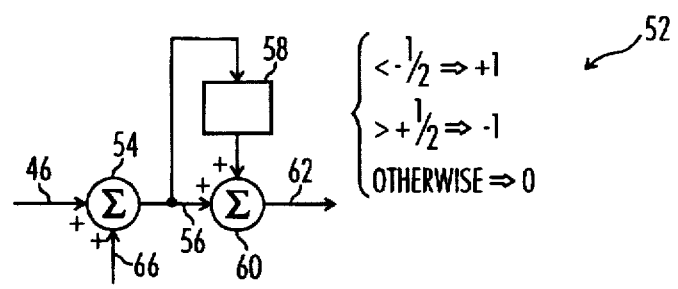
FIG. 3 is a schematic drawing of the mod one adder shown in FIG. 1.

FIG. 3 shows the details of the mod one adder 52. The mod one differentiated noise 46 is applied to one input a second adder 54, which produces a second sum 56. Second sum 56 is applied both to a second modulo filter 58 and to one input of a third adder 60. The second modulo filter 58 produces an output which is applied to a second input of the third adder 60. The second adder 54, second modulo filter 58, and third adder 60 together form the modulo adder 52, preferably a mod one adder 52. The second modulo filter 58 has the same structure as the first modulo filter 24 (FIG. 2), and likewise is preferably a mod one filter 58. The parameters (control limits and outputs) of the second modulo filter 58 should be the same as the parameters of the first modulo filter 24. If they are, the integration stage 50 will essentially undo the work of the differentiation stage 30. The preferred mod one adder 52 will be referred to throughout the remainder of the specification.

The output 62 of the mod one adder 52 is applied to a second delay element 64, which also delays the signal by one sample period. The output 66 of the second delay; element 64 is applied to a second input of the second adder 54 (FIG. 3), and thus is applied to a second input of the mod one adder 52 (FIG. 1). The sum 62 produced at the output of the third adder 60 is a very good estimate of the noise.

This noise estimate 62 is then subtracted from the original noisy input signal 12 in a fourth subtracter 68. An n-sample delay element 70 may be required to delay the original noisy input signal 12 before it is applied to the fourth subtracter 68. The n-sample delay element 70 is not required if the sampling frequency of the original noisy input signal 12 is significantly slower than the operating frequency of the foregoing digital signal processing apparatus. Otherwise, the respective frequencies will dictate the length of the delay to assure that the noise 62 is being subtracted from the part of the original noisy input signal 12 in which it originally appeared. The resulting difference 72 at the output of the fourth subtracter 68 is the smoothed signal. This last stage 74 is appropriately called the noise subtraction stage 74.

The original noisy signal 12 should be applied to the plus input of the fourth subtracter 68 without compensating for nonlinearity or anything else. Such compensations add to—rather than offset—the very minor distortion to the noise created in the process of producing the noise estimate 62. The only exception is the optional n-sample delay element 70.

Software Version

Figure 4:
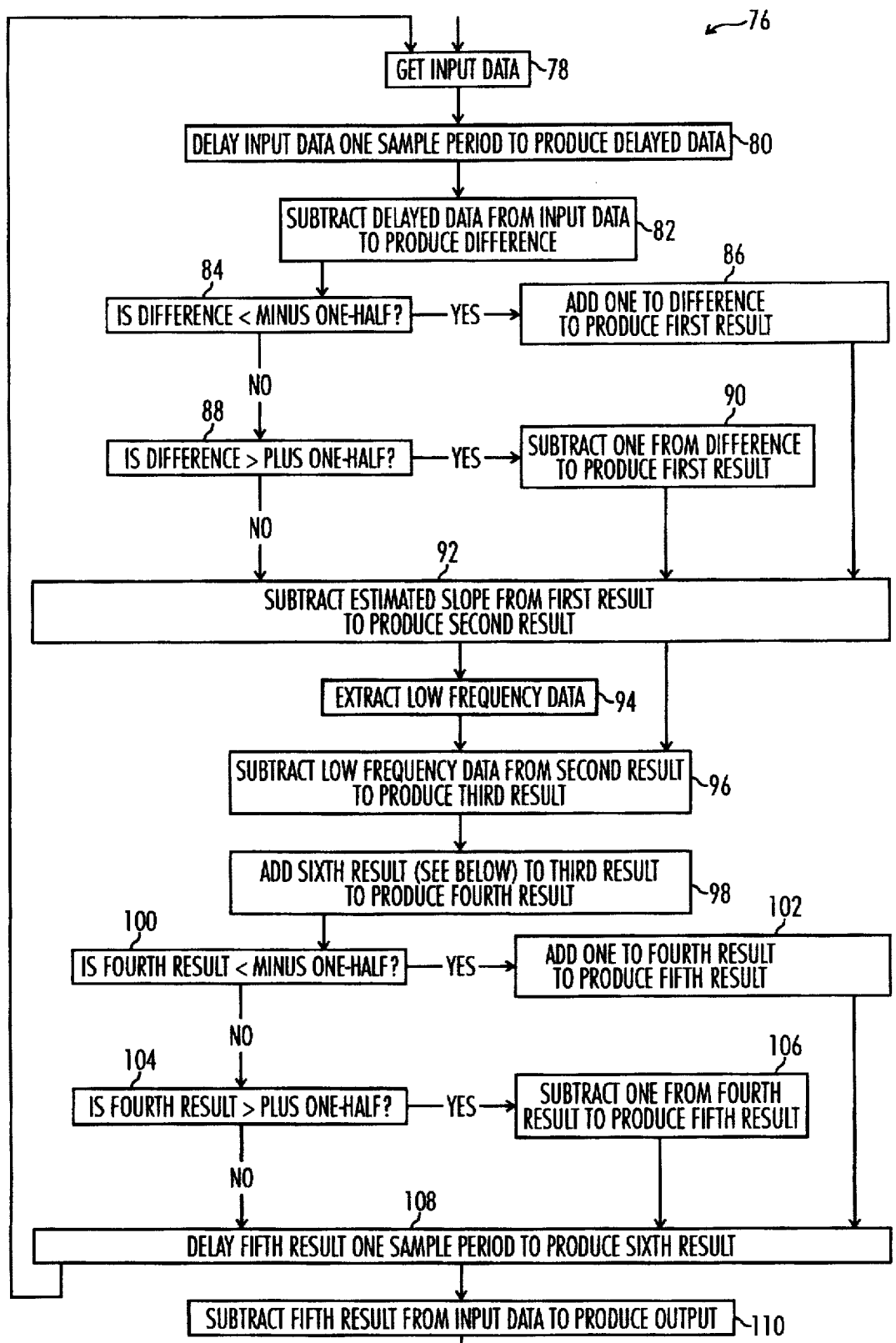
FIG. 4 is a flowchart of a software version of the first aspect of the present invention.

FIG. 4 is a flowchart of a software version 76 of the hardware version 10. The preferred mod one addition and subtraction is shown, since use of the preferred zero-to-one input data range is assumed. Other input data ranges will require other modulo arithmetic steps, as described above.

In step 78, input data is acquired from an periodic signal generator. This data is delayed for one sample period in step 80, and the delayed data is subtracted from the input data in step 82. If the difference is less than minus one-half, step 84, the difference is incremented by one to produce a first result, step 86. If the difference is greater than plus one-half, step 88, the difference is decremented by one to produce the first result, step 90.

Regardless of how the first result is obtained, an estimated slope is subtracted from it in step 92 to produce a second result. Low frequency data in the second result is extracted, step 94, and subtracted from the second result in step 96 to produce a third result. In step 98, the sixth result from step 108 is added to the third result to produce a fourth result.

If the fourth result is less than minus one-half, step 100, the fourth result is incremented by one to produce a fifth result, step 102. If the fourth result is greater than plus one-half, step 104, the fourth result is decremented by one to produce the fifth result, step 106.

Regardless of how the fifth result is obtained, it is delayed in step 110 by one sample period to produce a sixth result. This is the sixth result which is referred to above in step 98.

The fifth (not sixth) result is subtracted from the input data in step 110 to produce an output of the method. The next input data from the periodic signal generator may now be considered.

Second Aspect

Hardware Version

FIG. 5 shows a first periodic signal 76 and a second periodic signal 78. They have the same frequency f, and therefore have the same period T=1/f. For ease of understanding, the signals 76, 78 are shown as having a common minus-to-plus zero crossing 112, and thus may be considered to be "in phase". However, it is an advantage of the present invention that the amplitude and shape of second signal 78 are entirely arbitrary. Therefore, a phase of zero may or may not produce a second-signal 78 amplitude of zero, as the needs of the user may require.

FIG. 6 shows the phase 114 of the signals of FIG. 5. As in FIG. 5, the minus-to-plus zero crossing 112 of first signal 76 is conveniently considered to have a phase of zero. However, this choice is as arbitrary for first signal 76 as it is for second signal 78, and may be modified as the needs of the user may require.

FIG. 7 is a schematic drawing of a hardware version of the second aspect 116 of the present invention. A first periodic signal generator 118 generates the first periodic signal 76. An extractor 120 extracts the phase signal 12 (see FIG. 1) from the first periodic signal 76. This phase signal 12 is a digital sawtooth signal and has significant noise. The phase signal 12 is applied to the sawtooth filter 10, described in FIG. 1, and emerges as the smoothed signal 72. Smoothed signal 72 is applied to a second periodic signal generator 122, which generates the second periodic signal 78.

The extractor 120 has two functions: digitization and phase extraction. If the first periodic signal 76 is already a digital signal, or already is a sawtooth (phase) signal, then the extractor 120 may be correspondingly simplified. If the first periodic signal 76 is already both digital and a sawtooth, then the extractor 120 may be omitted.

Figure 8:
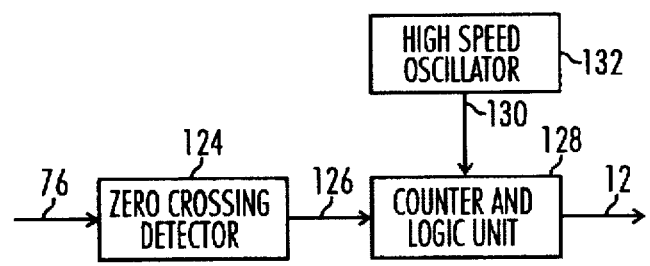
FIG. 8 is a schematic drawing of a preferred embodiment of the noisy digitized sawtooth extractor shown in FIG. 7.

FIG. 8 is a schematic drawing of a preferred embodiment of the noisy digitized sawtooth extractor 120 shown in FIG. 7. It addresses the typical situation, in which the first periodic signal 76 is neither digitized nor a sawtooth. The first periodic signal 76 is applied to a minus-to-plus zero crossing detector 124. The resulting detector output signal 126 is applied to a counter and logic unit 128, which also receives a high speed oscillator signal 130 from a high speed oscillator 132. Whenever the detector 124 detects a minus-to-plus zero crossing, it changes the detector output signal 126 from logical zero to logical one, and then immediately returns to logical zero. This logical one pulse zeroes out a counter in the counter and logic unit 128. The counter and logic unit 128 increments by one with each pulse of the high speed oscillator signal 130 from the high speed oscillator 132, and produces, in digital format, the number stored in the counter. This number is the sawtooth phase signal 12.

As noted above, smoothed signal 72 is applied to the second periodic signal generator 120, which generates the second periodic signal 78. The smoothed signal 72 is digital, but the second periodic signal 78 may be digital or analog, as the needs of the user may require.

Software Version

Figure 9:
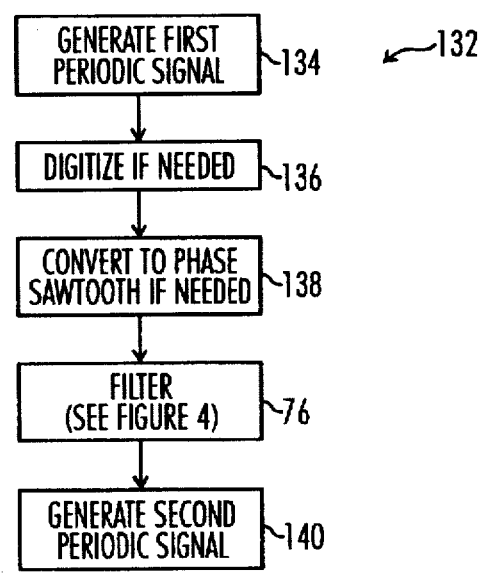
FIG. 9 is a flowchart of a software version of the second aspect of the present invention.

FIG. 9 is a flowchart of a software version 132 of the second aspect of the present invention. A first periodic signal is generated, step 134. This signal is digitized, step 136, and converted to a phase sawtooth, step 138. Either or both steps 136, 138 may be omitted if the first periodic signal is already digitized or a sawtooth. Steps 136 and 138 may also be reversed. The digitized sawtooth is filtered, step 76, according to the steps of FIG. 4. The resulting smooth sawtooth is used to generate, step 140, a second periodic signal.

SCOPE OF THE PRESENT INVENTION

Several specific embodiments of the present invention have been disclosed herein, but the true spirit and scope of the present invention are not limited thereto. Such limitations are imposed only by the appended claims and their equivalents.

What is claimed is:

1. Apparatus comprising:
   (a) means for acquiring, in digital sawtooth format, a periodic signal from a periodic signal generator;

(b) means for determining an expected slope of the periodic signal from a known resonant frequency of the periodic signal generator and a known range of the periodic signal;

(c) a first delay element connected to receive the periodic signal and to thereby produce a first delayed signal;

(d) a modulo subtracter connected to modulo subtract the first delayed signal from the periodic signal and to thereby produce a modulo differentiated input signal;

(e) a second subtracter connected to subtract the expected slope of the periodic signal from the modulo differentiated input signal and to thereby produce a modulo differentiated noise plus residual slope signal;

(f) a low pass filter connected to receive the modulo differentiated noise plus residual slope signal, and to thereby produce an estimated residual slope signal;

(g) a third subtracter connected to subtract the estimated residual slope signal from the modulo differentiated noise plus residual slope signal, thereby producing a low distortion modulo differentiated noise signal;

(h) a modulo adder connected to modulo add the low distortion modulo differentiated noise signal to the below-recited second delayed signal and to thereby produce a low distortion noise signal;

(i) a second delay element connected to receive the low distortion noise signal and to thereby produce a second delayed signal; and (j) a fourth subtracter connected to subtract the low distortion noise signal from the periodic signal and to thereby produce an output signal of the apparatus.

2. The apparatus of claim 1, wherein:

(a) the modulo subtracter comprises:
  (1) a first subtracter;
  (2) a first modulo filter connected to receive, as an input, an output from the first subtracter, and constructed to produce an output of:
    (A) a lower output if the input to the filter is greater than an upper control limit;
    (B) a middle output if the input to the filter is between a lower control limit and the upper control limit; and
    (C) an upper output if the input to the filter is less than the lower control limit; and
  (3) a first adder connected to receive, as inputs, the output from the first subtracter and the output from the first modulo filter, an output of the first adder being the output of the modulo subtracter; and (b) the modulo adder comprises:
  (1) a second adder;
  (2) a second modulo filter connected to receive, as an input, an output from the second adder, and constructed to produce an output of:
    (A) a lower output if the input to the filter is greater than an upper control limit;
    (B) a middle output if the input to the filter is between a lower control limit and the upper control limit; and
    (C) an upper output if the input to the filter is less than the lower control limit; and
  (3) a third adder connected to receive, as inputs, the output from the second adder and the output from the second modulo filter, an output of the third adder being the output of the modulo adder.

3. The apparatus of claim 2, wherein:

(a) the periodic signal has a range from zero to one; and (b) the each modulo adder and the modulo subtracter comprises a mod one filter which produces an output of:
  (1) minus one if an input to the filter is greater than one-half;
  (2) zero if the input to the filter is between minus one-half and plus one-half; and
  (3) plus one if the input to the filter is less than minus one-half.

4. The apparatus of claim 1, further comprising an n-sample delay unit connected between the periodic signal acquisition means of element (a) and the fourth subtracter of element (j), thereby causing the fourth subtracter to subtract the low distortion noise signal from an n-sample delayed periodic signal.

5. The apparatus of claim 1, wherein:

(a) the periodic signal acquiring means of element (a) comprises a first periodic signal generator constructed to generate a first periodic signal and means for extracting a digital sawtooth phase signal from the first periodic signal, and (b) the apparatus further comprises a second periodic signal generator constructed to generate a second periodic signal from the output signal of element (j).

6. The apparatus of claim 5, further comprising an n-sample delay unit connected between the periodic signal acquisition means of element (a) and the fourth subtracter of element (j), thereby causing the fourth subtracter to subtract the low distortion noise signal from an n-sample delayed periodic signal.

7. The apparatus of claim 5, wherein:

(a) the modulo subtracter comprises:
  (1) a first subtracter;
  (2) a first modulo filter connected to receive, as an input, an output from the first subtracter, and constructed to produce an output of:
    (A) a lower output if the input to the filter is greater than an upper control limit;
    (B) a middle output if the input to the filter is between a lower control limit and the upper control limit; and
    (C) an upper output if the input to the filter is less than the upper control limit; and
  (3) a first adder connected to receive, as inputs, the output from the first subtracter and the output from the first modulo filter, an output of the first adder being the output of the modulo subtracter; and (b) the modulo adder comprises:
  (1) a second adder;
  (2) a second modulo filter connected to receive, as an input, an output from the second adder, and constructed to produce an output of:
    (A) a lower output if the input to the filter is greater than an upper control limit;
    (B) a middle output if the input to the filter is between a lower control limit and the upper control limit; and
    (C) an upper output if the input to the filter is less than the upper control limit; and
  (3) a third adder connected to receive, as inputs, the output from the second adder and the output from the second modulo filter, an output of the third adder being the output of the modulo adder.

8. The apparatus of claim 7, wherein:

(a) the periodic signal has a range from zero to one; and (b) the each modulo adder and the modulo subtracter comprises a mod one filter which produces an output of:

(1) minus one if an input to the filter is greater than one-half;

(2) zero if the input to the filter is between minus one-half and plus one-half; and (3) plus one if the input to the filter is less than minus one-half.

9. A filtering method comprising the steps of:

(a) acquiring digitized sawtooth input data from an periodic signal generator;

(b) delaying the input data for one sample period, thereby producing delayed data;

(c) modulo subtracting the delayed data from the input data to produce a first result;

(d) subtracting an estimated slope from the first result to produce a second result;

(e) subtracting low frequency data in the second result from the second result to produce a third result;

(f) modulo adding the sixth result from step (g) to the third result to produce a fifth result;

(g) delaying the fifth result by one sample period to produce a sixth result;

(h) subtracting the fifth result from the input data to produce an output of the method; and (i) returning to step (a).

10. The method of claim 9; wherein:

(a) the modulo subtraction step comprises the steps of (1) subtracting the delayed data from the input data to produce a difference;

(2) if the difference between the input data and the delayed data is less than a lower control limit, then adjusting the difference by an upper output to produce the first result;

(3) if the difference between the input data and the delayed data is greater than an upper control limit, then adjusting the difference by a lower output to produce the first result; and (4) if the difference between the input data and the delayed data is between the lower control limit and the upper control limit, then adjusting the difference by a middle output to produce the first result; and (b) the modulo addition step comprises the steps of:

(1) adding the sixth result to the third result to produce a fourth result;

(2) if the fourth result is less than a lower control limit, then adjusting the fourth result by an upper output to produce the fifth result;

(3) if the fourth result is greater than an upper control limit, then adjusting the fourth result by a lower output to produce the fifth result; and (4) if the fourth result is between the lower control limit and the upper control limit, then adjusting the fourth result by a middle output to produce the fifth result.

11. The method of claim 10, wherein:

(a) the periodic signal has a range from zero to one; and (b) each upper control limit is plus one-half;

(c) each lower control limit is minus one-half;

(d) each upper output is plus one;

(e) each lower output is minus one; and (f) each middle output is zero.

12. The method of claim 9, further comprising the step of delaying the digitized sawtooth input data by n samples before subtracting the fifth result from it in step (g).

13. The method of claim 9, wherein:

(a) the digitized sawtooth acquiring step of step (a) comprises the steps of:

(1) generating a first periodic signal; and (2) extracting a digital sawtooth phase signal from the first periodic signal; and (b) the method further comprises the step of generating a second periodic signal from the output of the method in step (h).

14. The method of claim 13, wherein:

(a) the modulo subtraction step comprises the steps of:

(1) subtracting the delayed data from the input data to produce a difference;

(2) if the difference between the input data and the delayed data is less than a lower control limit, then adjusting the difference by an upper output to produce the first result;

(3) if the difference between the input data and the delayed data is greater than an upper control limit, then adjusting the difference by a lower output to produce the first result; and (4) if the difference between the input data and the delayed data is between the lower control limit and the upper control limit, then adjusting the difference by a middle output to produce the first result; and (b) the modulo addition step comprises the steps of:

(1) adding the sixth result to the third result to produce a fourth result;

(2) if the fourth result is less than a lower control limit, then adjusting the fourth result by an upper output to produce the fifth result;

(3) if the fourth result is greater than an upper control limit, then adjusting the fourth result by a lower output to produce the fifth result; and (4) if the fourth result is between the lower control limit and the upper control limit, then adjusting the fourth result by a middle output to produce the fifth result.

15. The method of claim 14, wherein:

(a) the periodic signal has a range from zero to one; and (b) each upper control limit is plus one-half;

(c) each lower control limit is minus one-half;

(d) each upper output is plus one;

(e) each lower output is minus one; and (f) each middle output is zero.

16. The method of claim 13, further comprising the step of delaying the digitized sawtooth input data by n samples before subtracting the fifth result from it in step (g).

* * * * *